United States Patent

Tuvell et al.

[19]

[11] Patent Number: 4,695,979
[45] Date of Patent: Sep. 22, 1987

[54] MODIFIED FOUR TRANSISTOR EEPROM CELL

[75] Inventors: James A. Tuvell, Houston; Michael C. Smayling, Missouri City, both of Tex.

[73] Assignee: Texas Instruments Incorporated, Dallas, Tex.

[21] Appl. No.: 773,492

[22] Filed: Sep. 9, 1985

[51] Int. Cl.[4] ............................................. G11C 11/34
[52] U.S. Cl. ..................................... 365/185; 365/104
[58] Field of Search ............... 365/185, 189, 104, 182; 357/23.5

[56] References Cited

U.S. PATENT DOCUMENTS 4,402,064  8/1983  Arakawa ............................. 365/185
4,628,487  12/1986  Smayling ............................ 365/185

FOREIGN PATENT DOCUMENTS 57-92488  6/1982  Japan ................................... 365/185

*Primary Examiner*—Joseph A. Popek
*Attorney, Agent, or Firm*—John G. Graham

[57] ABSTRACT

An electrically erasable programmable memory cell of the four transistor type in which a floating gate transistor has one end of its source to drain path coupled to the write line and the other end to the read line through a read switch. Its control gate is connected to the sense line. A tunnel device has a cathode connected to the floating gate of the floating gate transistor, and an anode through a write switch connected to the write line. The gates of both the read and write select transistors are connected to the row line. By coupling one end of the read switch to the read line rather than connecting one end of the source to drain path of the floating gate transistor to the read line for unselected cells in which the read switch is off, only the capacitance of one end of the read switch is added to the parasitic capacitance of the read line whether the floating gate of the floating gate transistor has previously been charged negatively or positively. Thus, the precharging time of the read line will be independent of the programmed condition of the cell and will result in an access time that is as fast or faster for either programmed condition than previously attainable.

6 Claims, 2 Drawing Figures

MODIFIED FOUR TRANSISTOR EEPROM CELL

BACKGROUND OF THE INVENTION

The present invention relates to a four transistor electrically erasable programmable read only memory cell.

The typical four transistor electrically erasable programmable read only memory cell (EEPROM) has four interconnected transistors coupled to four array lines, namely, a sense line, a row line, a read line and a write line. One transistor is of the floating gate type whose gate is connected to a cathode of a tunnel device. Programming of the device involves conditioning the floating gate by either removing from or adding electrons to the floating gate leaving it with a positive or negative voltage. If the voltage is negative, the floating gate transistor will be cut off during the read cycle and no discharge of the precharge voltage which is applied to the read line at the start of a read cycle will take place. If the floating gate voltage is positive then discharge of the precharge voltage on the read line will occur during the read cycle and the falling voltage value will be detected by a sense amplifier coupled to the read line.

The rate of precharging of the rear line has been found to differ in typical EEPROM cells depending on whether the floating gate has been previously charged negatively or positively. The result is a slower access time for one of the two programming conditions.

It is an object of the present invention to provide an improved four transistor EEPROM having a faster access time for certain programming conditions.

It is a further object of the present invention to make the access time independent of the programmed condition of the EEPROM, that is whether the floating gate of the floating gate transistor has been left with a positive or a negative voltage from a previous write cycle.

SUMMARY OF THE INVENTION

According to the invention, there is provided an electrically erasable programmable memory cell of the four transistor type in which a floating gate transistor has one end of its source to drain path coupled to the write line and the other end to the read line through a read switch. Its control gate is connected to the sense line. A tunnel device has a cathode connected to the floating gate of the floating gate transistor, and an anode through a write switch connected to the write line. Controls of both the read and write switches are connected to the row line. By coupling one end of the read switch to the read line rather than connecting one end of the source to drain path of the floating gate transistor to the read line for unselected rows in which the read switch is off only the capacitance of one end of the read switch is added to the parasitic capacitance of the read line whether the floating gate of the floating gate transistor has previously been charged negatively or positively. Thus, the precharging time of the read line will be independent of the programmed condition of the cell and will result in an access time that is as fast or faster for either programmed condition than previously attainable.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
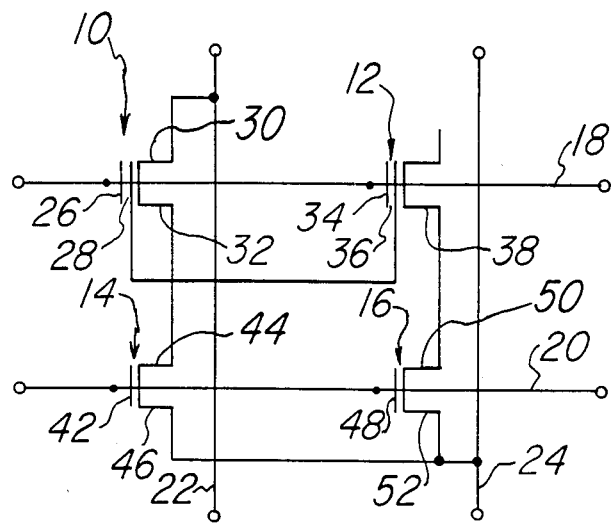
FIG. 1 is an electrical schematic diagram of a typical four transistor EEPROM.

Referring to FIG. 1, a typical prior art four transistor EEPROM cell has a floating gate transistor 10 with a source 30 coupled to a read line 22, a drain 32 coupled to a drain 44 of a read transistor 14 and a control gate 26 connected to a sense line 18. A floating gate 28 of transistor 10 is connected to a cathode 36 of a tunnel diode device 12. A source 46 of read transistor 14 connects to write line 24 and to a source 52 of a write transistor 16. A drain 50 of write transistor 16 connects to an anode 38 of tunnel device 12. Gates 42 and 48 of transistors 14 and 16, respectively, both connect to a row line 20 while gate 34 of tunnel device 12 connects to the sense line 18.

The cell of FIG. 1 is programmed so as to make the voltage on the floating gate 28 either positive or negative. To make it negative, electrons are tunneled onto the floating gate 28 through the tunnel device 12 by raising the sense line 18 to the programming voltage Vpp (typically +17 volts), lowering the voltage of the write line 24 to OV and then applying a selection voltage to row line 20.

To charge the floating gate 28 to a positive voltage the sense line 18 is set to OV, the write line 24 to Vpp and a selection voltage applied to the row line 20. During both programming operations the read line 22 floats. When electrons are tunneled off of the floating gate 28 the resulting positive potential of the floating gate 28 is enough to keep transistor 10 on even if the voltage on the sense line is OV.

The read operation of the EEPROM cell of FIG. 1 consists of connecting the write line 24 to ground, precharging the read line 22, raising the sense line 18 voltage to about 2 volts (a value intermediate between the threshold voltage V+ corresponding to the charge and discharged conditions of floating gate transistor) and then applying a selection voltage to the row line 20. If the floating gate 28 is at a negative potential transistor 10 will remain off when the cell is read and the read line 22 will remain at the precharge level.

If the floating gate 28 is at a positive potential, transistor 10 will be on during the precharge and when a selection voltage is applied to row line 20, transistor 10 will allow the read line 22 to discharge to the write line 24. A sense amplifier (not shown) coupled to the read line detects whether or not it is discharged during a read cycle.

The time to precharge the read line 22 is longer when transistor 10 is on because of the increased capacitance coupled to the read line 22 over that coupled to the read line 22 when transistor 10 is off. When the floating gate 28 has a negative potential transistor 10 will be off during the read operation and the capacitance of the read line 22 consists of the parasitic capacitance of the read line plus the capacitance of the source area of transistor 10. However, for a positive potential on floating gate 28, transistor 10 will be on during the read operation and the capacitance of the read line 22 will be the parasitic capacitance of the read line 22 plus the capacitance of the source 30 and gate 26 of transistor 10 and the capacitance of the common drain area of transistors 10 and 14. Since the read line 22 is in common with all cells on a given column, the increase in capacitance becomes very significant for large arrays when all cells on a column have been programmed so that their respective floating gates 28 have a positive potential.

Figure 2:
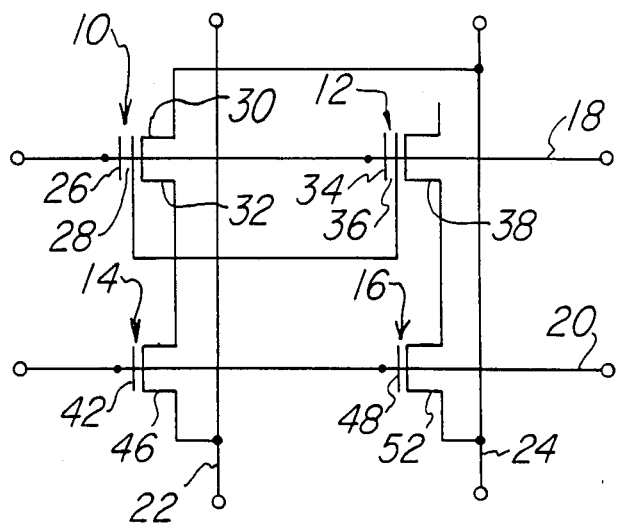
FIG. 2 is an electrical schematic diagram of a four transistor EEPROM modified according to a preferred embodiment of the invention.

The modified four transistor EEPROM shown in FIG. 2 couples the source 30 of transistor 10 to the write line 24 rather than to the read line 22 and the source 46 of the read transistor 14 to the read line 22 rather than to the wire line 24. Otherwise the circuit is the same as that of FIG. 1. The major change in operation of the cell is that during precharging of the read line 22 the source 46 of read transistor 14 which is off for unselected cells is connected to the read line rather than the source 30 of transistor 10 which is on. Another difference is that current from the read line travels through transistor 14 from source 46 to drain 44 and through transistor 10 from drain 32 to source 30 to the write line 24 once a selection voltage is applied to the row line 20. In FIG. 1 current from the read line 22 travelled in the opposite direction through transistors 10 and 14.

With the circuit of FIG. 2 the capacitance on the read line 22 during precharge is the parasitic capacitance of the read line 22 plus the capacitance of the source region of transistor 14 for those cells coupled to read line 22 which have not been selected and in which read transistor 14 is off. Thus, the precharge of the circuit of FIG. 2 is independent of the programmed state of transistor 10 and is at least as fast as the fastest precharge time for both programmed conditions for the circuit of FIG. 1.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed:

1. An electrically erasable programmable memory cell of a type having interconnected transistors coupled to a conducting read, write, sense and row line, comprising:
   a floating gate transistor having a control gate, connected to said sense line, a source to drain conducting path and a floating gate;
   a tunnel device having a cathode coupled to the floating gate, an anode, and a tunnel control electrode coupled to the sense line;
   read switch means for providing a conducting path between said read line and one end of the source to drain path of said floating gate transistor in response to the voltage on said row line exceeding a selective threshold value and for opening the conductive path when the row line voltage falls below the selective threshold value;
   write switch means for providing a conductive path between said write line and the anode of said tunnel device in response to the voltage on said row line exceeding a write selective value and for opening the conductive path when the row line voltage falls below the write selective value;
   wherein another end of the source to drain path of said floating gate transistor is connected to said write line and said tunnel device is operative in response to a voltage between said sense line and said write line exceeding a tunnel threshold value to tunnel electrons to or from said cathode.

2. A memory cell according to claim 1, wherein said tunnel control electrode is a tunnel control gate connected to said sense line and, in response to the voltage from the gate to anode of said tunnel device exceeding a tunnel threshold value, electrons tunnel between the cathode and anode.

3. A memory cell according to claim 1, wherein said read switch means is a read transistor having a gate connected to said row line and a source to drain path coupled at one end to the source to drain path of said floating gate transistor and at another end to said read line.

4. A memory cell according to claim 3, wherein said write switch means is a write transistor having a source to drain path coupled at one end to the anode of said tunnel device and at another end to said write line.

5. A memory cell according to claim 4, wherein a drain of said floating gate transistor is connected to a drain of said read transistor and a drain of said write transistor is connected to the anode of said tunnel device.

6. An electrically erasable programmable memory cell of a type having interconnected transistors coupled to a conducting read, write, sense and row line, comprising;
   a floating gate transistor having a control gate, connected to said sense line, a source to drain conducting path and a floating gate;
   a tunnel device having a cathode coupled to the floating gate, an anode, and a tunnel control electrode coupled to the sense line;
   a read transistor having a source to drain path coupled between the read line and one end of the source to drain path of said floating gate transistor and having a control gate coupled to the row line operative in response to the voltage on said row line exceeding a selective threshold value to become conductive;
   a write transistor having a source to drain path coupled between the write line and the anode of said tunnel device and having a gate coupled to the row line and operative to conduct in response to the voltage on said row line exceeding a write selective value;
   wherein another end of the source to drain path of said floating gate transistor is connected to said write line and said tunnel device is operative to tunnel electrons to or from said cathode in response to a voltage between said sense line and said write line exceeding a tunnel threshold value.

* * * * *